(12) United States Patent
Kim et al.

(10) Patent No.: US 8,741,540 B2
(45) Date of Patent: Jun. 3, 2014

(54) HARD MASK COMPOSITION, METHOD OF FORMING A PATTERN, AND SEMICONDUCTOR INTEGRATED CIRCUIT DEVICE INCLUDING THE PATTERN

(75) Inventors: Min-Soo Kim, Uiwang-si (KR); Hwan-Sung Cheon, Uiwang-si (KR); Jee-Yun Song, Uiwang-si (KR); Young-Min Kim, Uiwang-si (KR); Cheol-Ho Lee, Uiwang-si (KR); Chung-Heon Lee, Uiwang-si (KR)

(73) Assignee: Cheil Industries, Inc., Gumi-Si, Kyeongsangbuk-Do (KR)

( * ) Notice: Subject to any disclaimer, the term of this patent is extended or adjusted under 35 U.S.C. 154(b) by 108 days.

(21) Appl. No.: 13/241,389

(22) Filed: Sep. 23, 2011

(65) Prior Publication Data
US 2012/0168894 A1    Jul. 5, 2012

(30) Foreign Application Priority Data

Dec. 30, 2010 (KR) .................. 10-2010-0139422

(51) Int. Cl.
G03F 7/00 (2006.01)
G03F 7/004 (2006.01)
G03F 7/11 (2006.01)
G03F 7/40 (2006.01)

(52) U.S. Cl.
USPC ............... 430/270.1; 430/271.1; 430/322; 430/330

(58) Field of Classification Search
USPC ...................... 430/270.1, 271.1
See application file for complete search history.

(56) References Cited

U.S. PATENT DOCUMENTS 5,837,419 A    11/1998    Ushirogouchi et al.
6,933,093 B1    8/2005    Arias et al.
(Continued)

FOREIGN PATENT DOCUMENTS

CN    101205291 A    6/2008
CN    101470352 A    7/2009
(Continued)

OTHER PUBLICATIONS

English language machine translation of JP 2004-205676 (no date).*
(Continued)

*Primary Examiner* — Amanda C. Walke
(74) *Attorney, Agent, or Firm* — Lee & Morse, P.C.

(57) ABSTRACT

A hard mask composition, a method of forming a pattern, and a semiconductor integrated circuit device, the hard mask composition including a solvent; and an aromatic ring-containing compound, the aromatic ring-containing compound including at least one of a moiety represented by the following Chemical Formula 1 and a moiety represented by the following Chemical Formula 2:

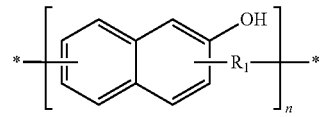

[Chemical Formula 1]

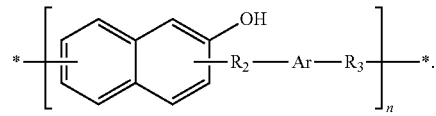

[Chemical Formula 2]

14 Claims, 1 Drawing Sheet

(56) References Cited

U.S. PATENT DOCUMENTS

| | | |
|---|---|---|
| 7,659,051 B2 | 2/2010 | Yoon et al. |
| 2003/0165774 A1 | 9/2003 | Arias et al. |
| 2008/0153033 A1 | 6/2008 | Hyung et al. |
| 2009/0176165 A1* | 7/2009 | Cheon et al. ............ 430/5 |
| 2010/0021830 A1* | 1/2010 | Kim et al. ............... 430/5 |
| 2010/0279509 A1 | 11/2010 | Kim et al. |
| 2010/0316950 A1 | 12/2010 | Oguro et al. |

FOREIGN PATENT DOCUMENTS

| | | | |
|---|---|---|---|
| CN | 101641390 A | | 2/2010 |
| CN | 101910947 A | | 8/2010 |
| JP | 06-130661 A | | 5/1994 |
| JP | 09-127691 A | | 5/1997 |
| JP | 2004-205676 A | | 7/2004 |
| JP | 2004-205685 A | | 7/2004 |
| JP | 2004205676 A | * | 7/2004 |
| KR | 10-2006-0116133 A | | 11/2006 |
| KR | 10-2007-0114866 A | | 12/2007 |
| KR | 10-0826104 B1 | | 4/2008 |
| KR | 10-0833212 B1 | | 5/2008 |
| KR | 10-2008-0107208 A | | 12/2008 |
| KR | 10-2010-0095563 A | | 8/2010 |
| WO | WO 2008120855 A1 | * | 10/2008 |

OTHER PUBLICATIONS

Chinese Search Report in CN 201110315277.X, dated Mar. 14, 2013, with English Translation (Kim et al.).

* cited by examiner

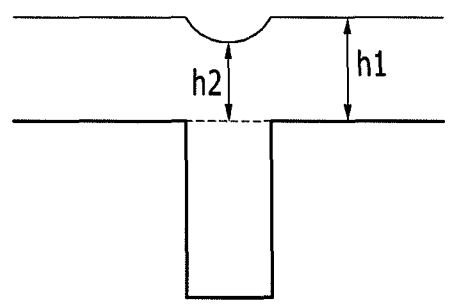

HARD MASK COMPOSITION, METHOD OF FORMING A PATTERN, AND SEMICONDUCTOR INTEGRATED CIRCUIT DEVICE INCLUDING THE PATTERN

BACKGROUND

1. Field of the Invention

Embodiments relate to a hard mask composition, a method of forming a pattern using the same, and a semiconductor integrated circuit device including the pattern.

2. Description of the Related Art

In industrial fields including microelectronics manufacturing as well as microscopic structure manufacturing, e.g., micromachines, magnetoresist heads, etc., chips including many circuits with a decreased size of patterns are desirable.

An effective lithography technique is desirable for decreasing the size of patterns. Lithography affects the fabrication of a microscopic structure not only in terms of directly imaging a pattern on a predetermined substrate but also in terms of fabricating a mask typically used for such imaging.

A typical lithography process may include a process of forming a patterned resist layer by exposing a radiation-sensitive resist to an imaging radioactive ray. Then, a pattern image is obtained by developing the exposed resist layer with a development solution. A pattern is then transferred onto an underlying material by etching the material through an opening of the patterned resist layer. After the transfer of the pattern, the remaining resist layer is removed.

However, in some lithography imaging processes, the resist layer may not provide sufficient resistance to effectively transfer a predetermined pattern to the layer under the resist in the subsequent etching process.

Therefore, when, e.g., an ultrathin film resist layer is needed, when the layer (under the hard mask layer) to be etched is thick, when an etching depth is large, and/or when a particular etchant is used for the layer under the hard mask layer, a hard mask layer may be used as an intermediate layer between the resist layer and the material layer to be patterned through transfer from the patterned resist.

The hard mask layer may accommodate the pattern from the patterned resist layer and may be resistant against an etching process for transferring the pattern onto the material layer.

SUMMARY OF THE INVENTION

Embodiments are directed to a hard mask composition, a method of forming a pattern using the same, and a semiconductor integrated circuit device including the pattern.

The embodiments may be realized by providing a hard mask composition including a solvent; and an aromatic ring-containing compound, the aromatic ring-containing compound including at least one of a moiety represented by the following Chemical Formula 1 and a moiety represented by the following Chemical Formula 2:

[Chemical Formula 1]

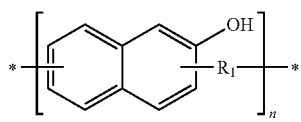

[Chemical Formula 2]

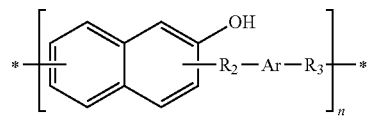

wherein Ar is an aromatic ring group, $R_1$ to $R_3$ are each independently a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, and n is 1 to about 100.

The aromatic ring-containing compound may include the moiety represented by Chemical Formula 2, and Ar may be an aromatic ring group selected from substituted or unsubstituted aromatic ring groups shown in the following Group 1:

[Group 1]

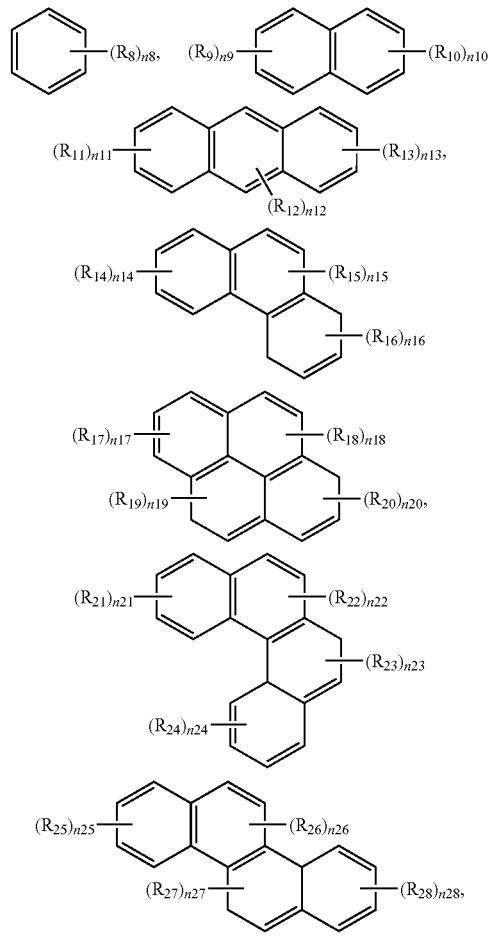

-continued

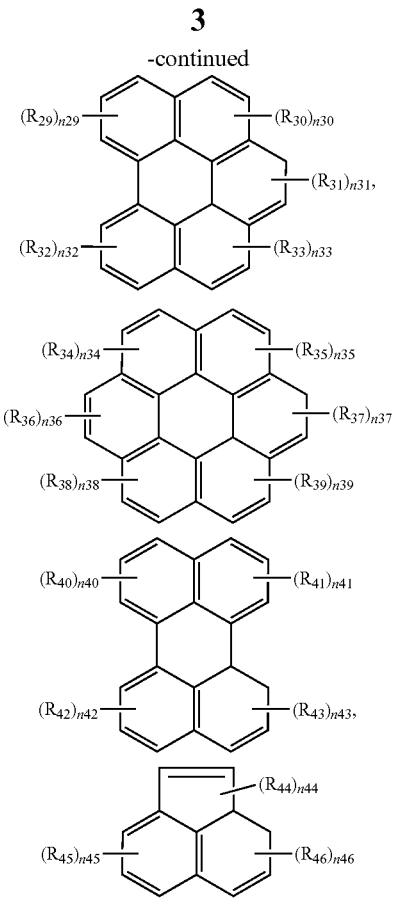

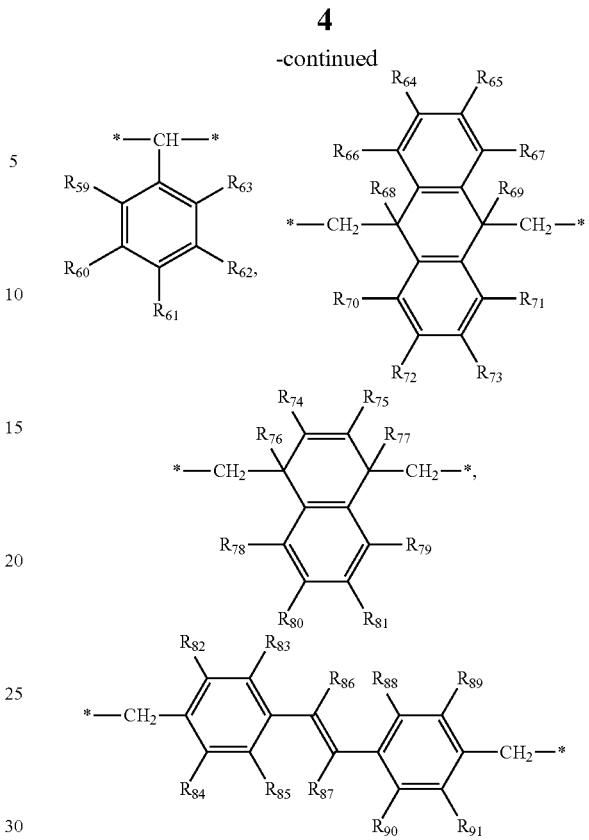

wherein $R_{47}$ to $R_{91}$ are each independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof.

The aromatic ring-containing compound may have a weight average molecular weight of about 1,000 to about 30,000.

The aromatic ring-containing compound may be included in the composition in an amount of about 1 to about 20 parts by weight, based on 100 parts by weight of the solvent.

The solvent may include at least one selected from the group of propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, and acetylacetone.

wherein $R_8$ to $R_{46}$ are each independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, and $n_8$ to $n_{46}$ are each independently 1 to 5.

$R_1$ to $R_3$ may each independently be one of a substituted or unsubstituted coupler shown in the following Group 2:

[Group 2]

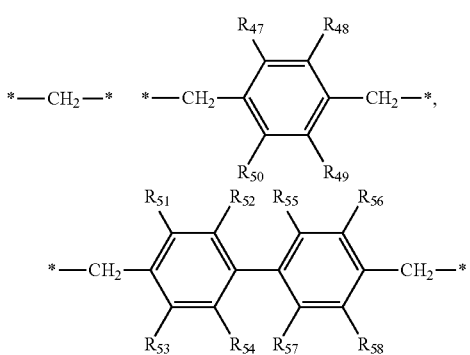

The embodiments may also be realized by providing a method for forming a pattern, the method including providing a material layer on a substrate; forming a hard mask layer on the material layer such that the hard mask layer is prepared from a hard mask composition including a solvent, and an aromatic ring-containing compound, the aromatic ring-containing compound including at least one of a moiety represented by the following Chemical Formula 1 and a moiety represented by the following Chemical Formula 2; forming a resist layer on the hard mask layer; forming a resist pattern by exposing and developing the resist layer; selectively removing a portion of the hard mask layer, using the resist pattern as a mask, to expose a portion of the material layer; and etching the exposed portion of the material layer:

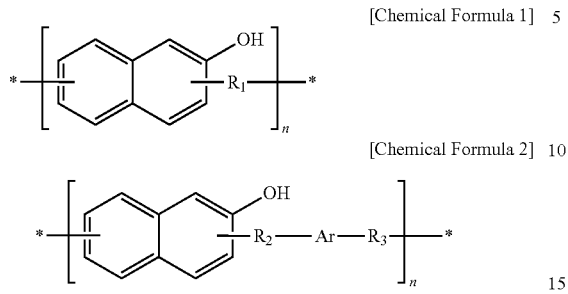

[Chemical Formula 1]

[Chemical Formula 2]

wherein Ar is an aromatic ring group, $R_1$ to $R_3$ are each independently a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, and n is 1 to about 100.

The aromatic ring-containing compound may include the moiety represented by Chemical Formula 2, and Ar may be an aromatic ring group selected from substituted or unsubstituted aromatic ring groups shown in the following Group 1:

[Group 1]

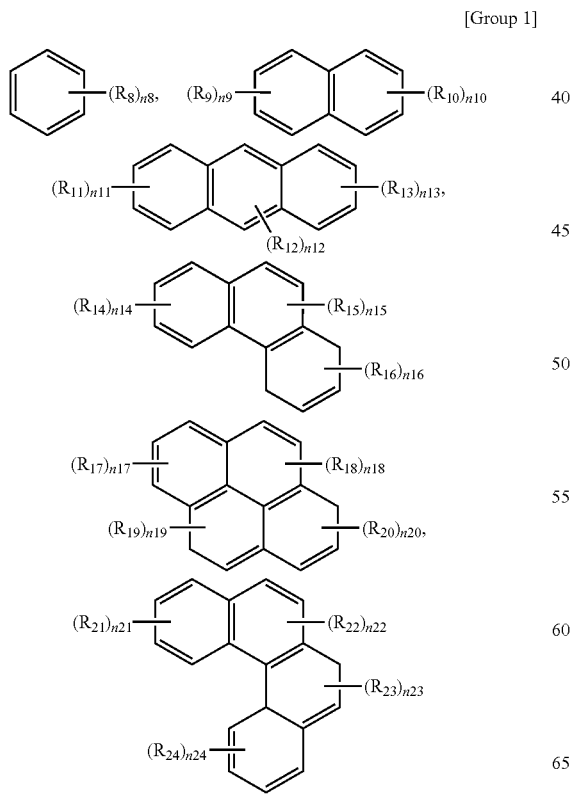

wherein $R_8$ to $R_{46}$ are each independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, and $n_s$ to $n_{46}$ are each independently 1 to 5.

$R_1$ to $R_3$ may each independently be one of a substituted or unsubstituted coupler shown in the following Group 2:

[Group 2]

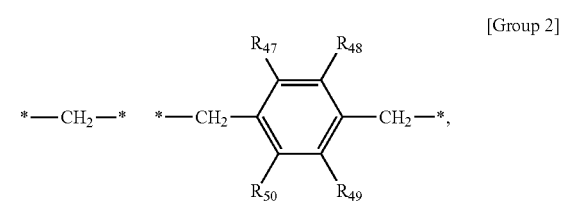

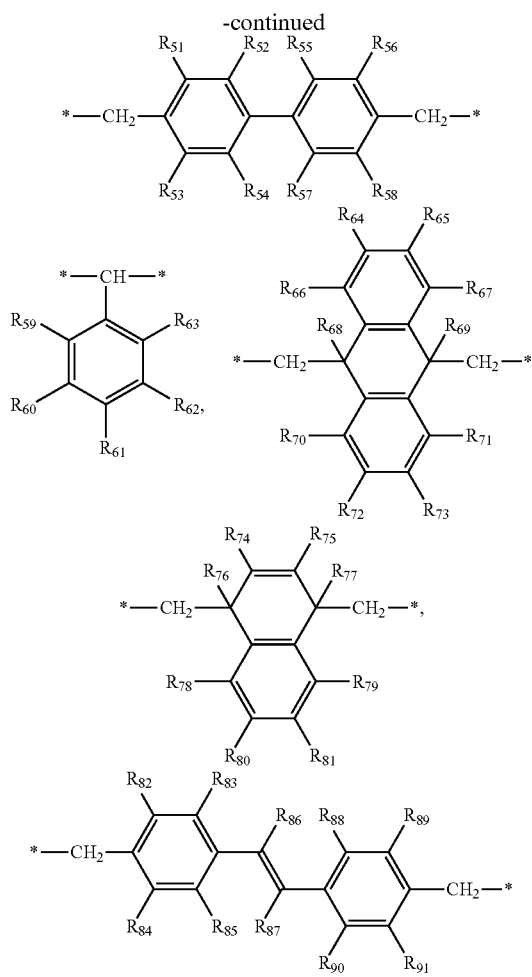

wherein $R_{47}$ to $R_{91}$ are each independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof.

The aromatic ring-containing compound may have a weight average molecular weight of about 1,000 to about 30,000.

The solvent may include at least one selected from the group of propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, and acetylacetone.

Forming the hard mask layer may include applying the hard mask composition by a spin-on-coating process.

The method may further include forming a silicon-containing auxiliary layer on the material layer prior to forming the resist layer.

The method may further include forming a bottom antireflective coating layer (BARC) prior to forming the resist layer.

The embodiments may also be realized by providing a semiconductor integrated circuit device including a plurality of patterns formed through the method according to an embodiment.

BRIEF DESCRIPTION OF THE DRAWINGS

The embodiments will become more apparent to those of ordinary skill in the art by describing in detail exemplary embodiments with reference to the attached drawings, in which:

FIG. 1 illustrates height differences for measuring planarization characteristics.

DETAILED DESCRIPTION

Korean Patent Application No. 10-2010-0139422, filed on Dec. 30, 2010, in the Korean Intellectual Property Office and entitled: "Hard Mask Composition and Method of Forming Patterns, and Semiconductor Integrated Circuit Device Including the Patterns," is incorporated by reference herein in its entirety.

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

As used herein, when a definition is not otherwise provided, the term "substituted" may refer to one substituted with at least a substituent selected from a halogen (F, Br, Cl, or I), a hydroxy group, a C1 to C20 alkoxy group, a nitro group, a cyano group, an amino group, an azido group, an amidino group, a hydrazino group, a hydrazono group, a carbonyl group, a carbamyl group, a thiol group, an ester group, an carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C15 cycloalkyl group, a C3 to C15 cycloalkenyl group, a C6 to C15 cycloalkynyl group, a heterocycloalkyl group, and a combination thereof.

As used herein, when a definition is not otherwise provided, the prefix "hetero" may refer to one including 1 to 3 heteroatoms selected from N, O, S, and P.

Hereinafter, a hard mask composition according to an embodiment is described.

The hard mask composition may include an aromatic ring-containing compound and a solvent.

The aromatic ring-containing compound may include at least one of a moiety represented by the following Chemical Formula 1 and a moiety represented by the following Chemical Formula 2.

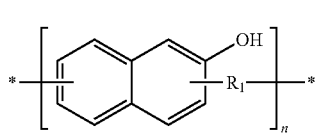

[Chemical Formula 1]

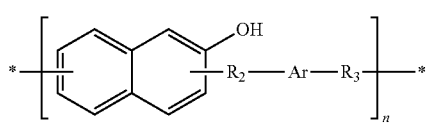

[Chemical Formula 2]

In Chemical Formulae 1 and 2,

Ar may be an aromatic ring group, $R_1$ to $R_3$ may each independently be a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, and n may be 1 to about 100.

As described above, Ar may be an aromatic ring group. In an implementation, the aromatic ring group may be a ring group where electrons are delocalized or resonated and may include an aryl group, a heteroaryl group, or a combination thereof.

For example, Ar may be an aromatic ring group selected from the substituted or unsubstituted aromatic ring groups shown in the following Group 1.

[Group 1]

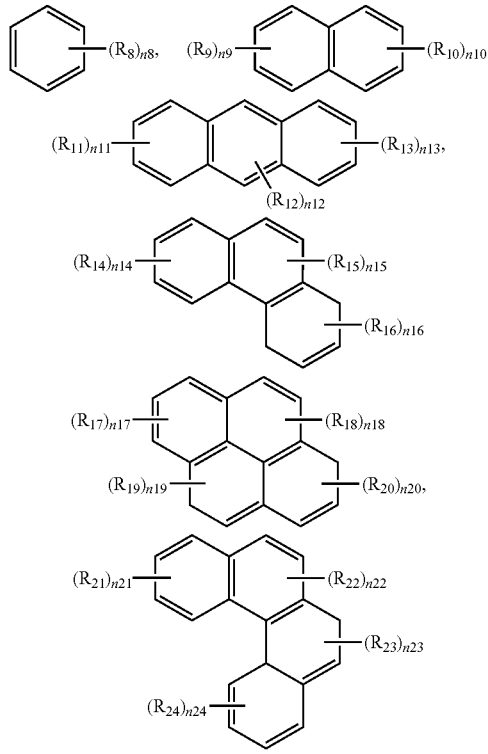

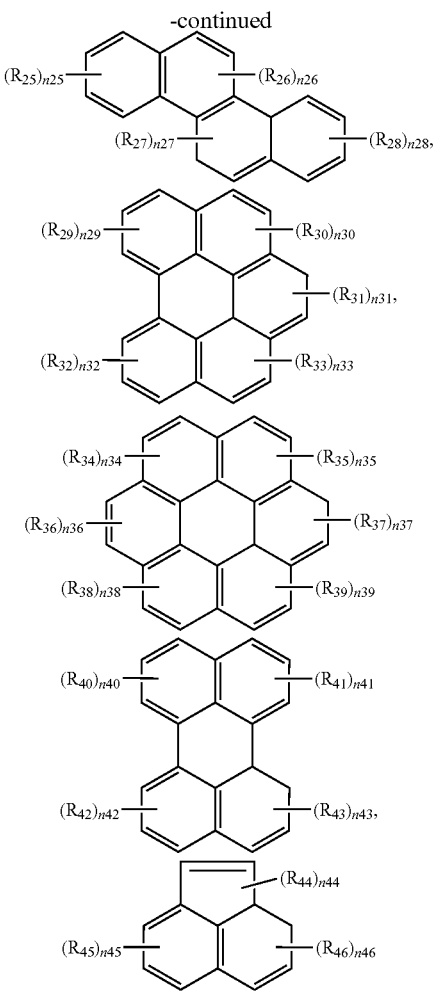

In Group 1, $R_9$ to $R_{46}$ may each independently be hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, and $n_8$ to $n_{46}$ may each independently be 1 to 5.

The aromatic ring groups of Group 1 may be coupled with $R_2$ and $R_3$ of the above Chemical Formula 2 at any carbons thereof, and the position is not limited to a specific one.

In an implementation, $R_1$ to $R_3$ may each independently be a coupler selected from the substituted or unsubstituted couplers shown in the following Group 2.

[Group 2]

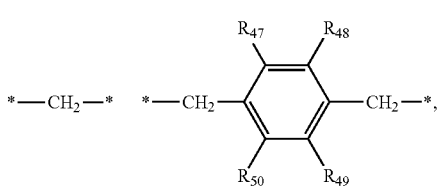

-continued

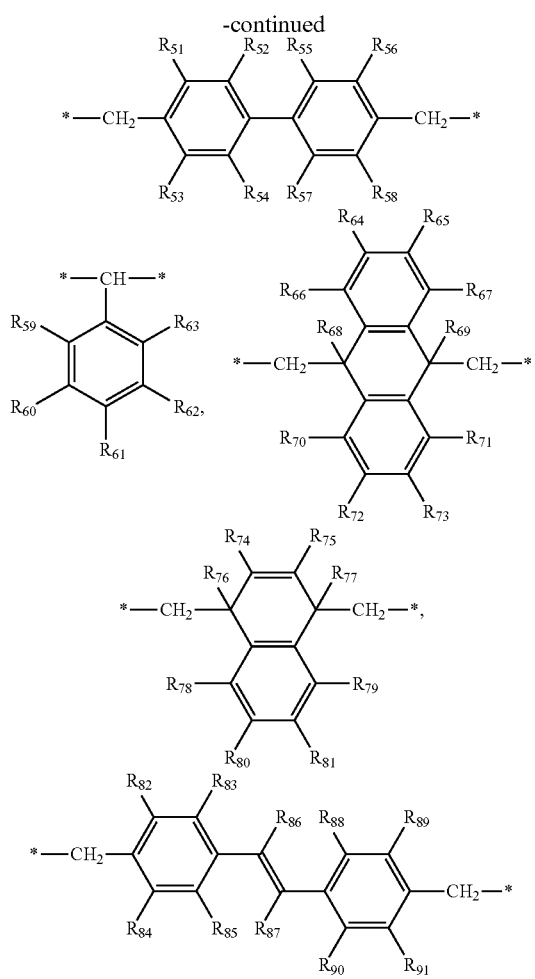

In Group 2, $R_{47}$ to $R_{91}$ may each independently be hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof.

The aromatic ring-containing compound may absorb light of a predetermined wavelength region. In an implementation, the light of the predetermined wavelength region may be a short wavelength region, e.g., about 193 nm and/or about 243 nm.

In an implementation, the aromatic ring-containing compound may include a mixture of two or more aromatic ring-containing compounds having different substituents.

The aromatic ring-containing compound may have a weight average molecular weight of about 1,000 to about 30,000. Maintaining the weight average molecular weight within the above range may help ensure excellent gap-fill properties and planarization characteristics. Also, a desired coating thickness may be achieved by securing solubility.

The aromatic ring-containing compound may be included in the composition in an amount of about 1 to about 20 parts by weight, based on 100 parts by weight of the solvent. In an implementation, the aromatic ring-containing compound may be included in an amount of about 5 to about 15 parts by weight. Maintaining the aromatic ring-containing compound within the range may help ensure god coating characteristics while also improving optical properties.

The solvent is not particularly limited. For example the aromatic ring-containing compound should exhibit sufficient solubility or dispersion in the solvent. In an implementation, the solvent may include at least one selected from the group of propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, and acetylacetone.

The hard mask composition may further include an additive including, e.g., a surfactant, an acid catalyst, and/or a cross-linking agent.

The surfactant may include, e.g., an alkylbenzene sulfonate salt, an alkyl pyridinium salt, polyethylene glycol, or a quaternary ammonium salt, but is not limited thereto.

The acid catalyst may be, e.g., a thermally activated acid catalyst. For example, an organic acid such as p-toluene sulfonic acid monohydrate may be used, and a thermal acid generator (TAG) designed for storage stability may be used. The thermal acid generator is an acid generator that emits acid during a thermal treatment, e.g., pyridinium p-toluene sulfonate, 2,4,4,6-tetrabromocyclohexadienone, benzoin tosylate, 2-nitrobenzyl tosylate, and/or an alkylester of an organic sulfonic acid.

The cross-linking agent may link repeating units of a polymer through heating in the presence of the acid catalyst. Non-limiting examples of the cross-linking agent may include an amino resin, e.g., an etherificated amino resin; a glycoluril compound, e.g., a compound represented by the following Chemical Formula A; a bisepoxy compound, e.g., a compound represented by the following Chemical Formula B; a melamine resin, for example, N-methoxymethyl melamine resin, N-butoxymethyl melamine resin, or a compound represented by the following Chemical Formula C; or a mixture thereof.

[Chemical Formula A]

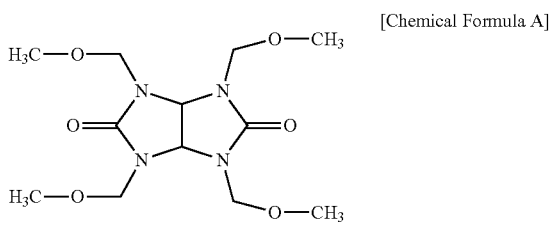

[Chemical Formula B]

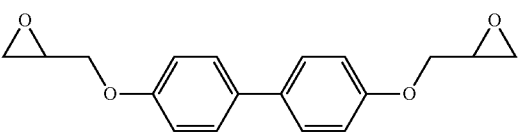

[Chemical Formula C]

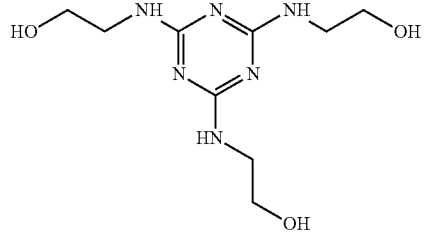

The surfactant, the acid catalyst, and/or the cross-linking agent may be included in the composition in an amount of about 0.001 to about 3 parts by weight, based on 100 parts by weight of the hard mask composition, respectively. Maintaining the amount of the surfactant, the acid catalyst, and/or the cross-linking agent within the range may help ensure that the solubility and the cross-linking are secured without changing the optical properties of the hard mask composition or the hard mask layer prepared therefrom.

Hereafter, a method for forming patterns by using the hard mask composition of an embodiment is described.

The method of forming a pattern may include providing a material layer on a substrate, forming a hard mask layer on the material layer (using the hard mask composition including an aromatic ring-containing compound and a solvent), forming a resist layer on the hard mask layer, exposing and developing the resist layer to provide a resist pattern, selectively removing a portion of the hard mask layer using the resist pattern as a mask to expose a portion of the material layer, and etching the exposed portion of the material layer.

The substrate may be, e.g., a silicon wafer, a glass substrate, or a polymer substrate.

The material layer may be a material to be finally patterned, e.g., a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The hard mask layer may be formed by applying a hard mask composition. The hard mask composition may include an aromatic ring-containing compound and a solvent.

The aromatic ring-containing compound may include at least one of a moiety represented by the following Chemical Formula 1 and a moiety represented by the following Chemical Formula 2.

[Chemical Formula 1]
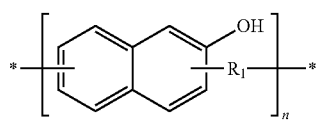

[Chemical Formula 2]
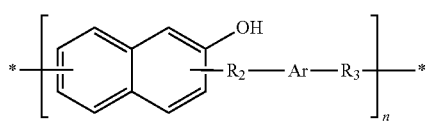

In Chemical Formulae 1 and 2,
Ar may be an aromatic ring group,
$R_1$ to $R_3$ may each independently be a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, and
n may be 1 to about 100.

As described above, Ar may be an aromatic ring group. In an implementation, the aromatic ring group may be a ring group where electrons are delocalized or resonated and may include an aryl group, a heteroaryl group, or a combination thereof.

For example, Ar may be an aromatic ring group selected from the substituted or unsubstituted aromatic ring groups shown in the following Group 1.

[Group 1]
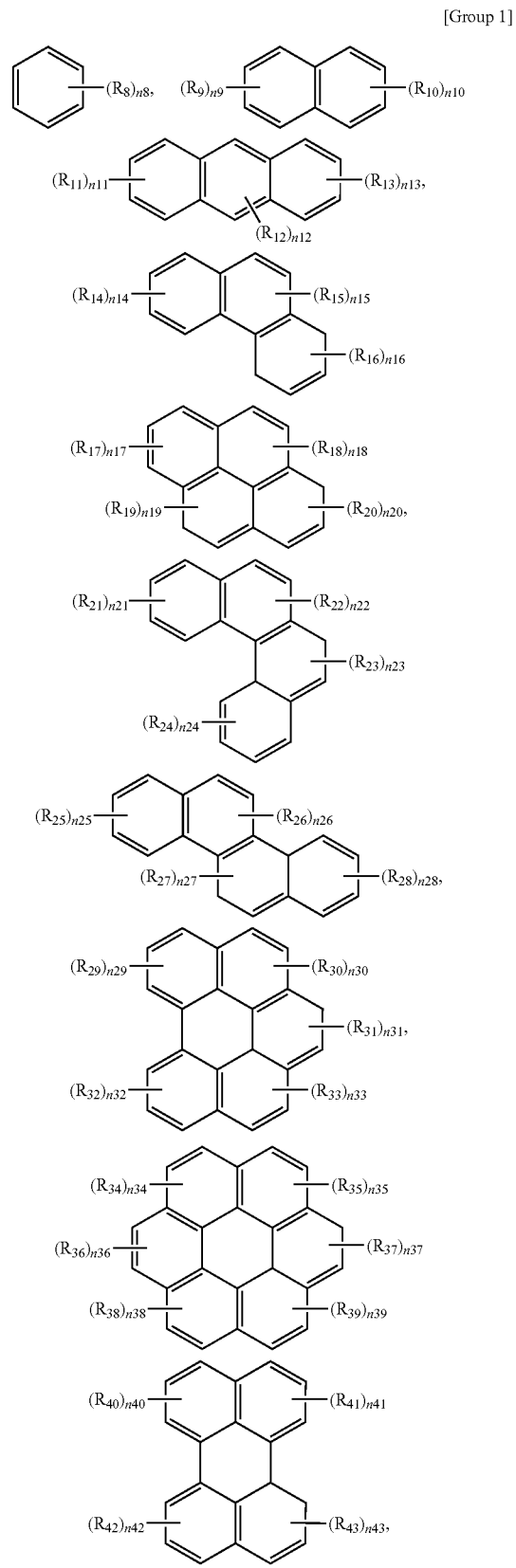

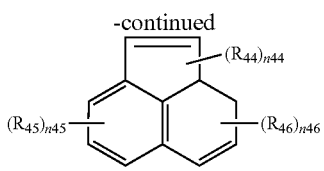

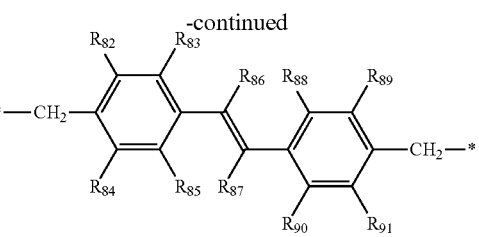

In Group 1, $R_8$ to $R_{46}$ may each independently be hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, and $n_8$ to $n_{46}$ may each independently be 1 to 5.

The aromatic ring groups of Group 1 may be coupled with $R_2$ and $R_3$ of the above Chemical Formula 2 at any carbons thereof, and the position is not limited to a specific one.

In an implementation, $R_1$ to $R_3$ may each independently be a coupler selected from the substituted or unsubstituted couplers shown in the following Group 2.

[Group 2]

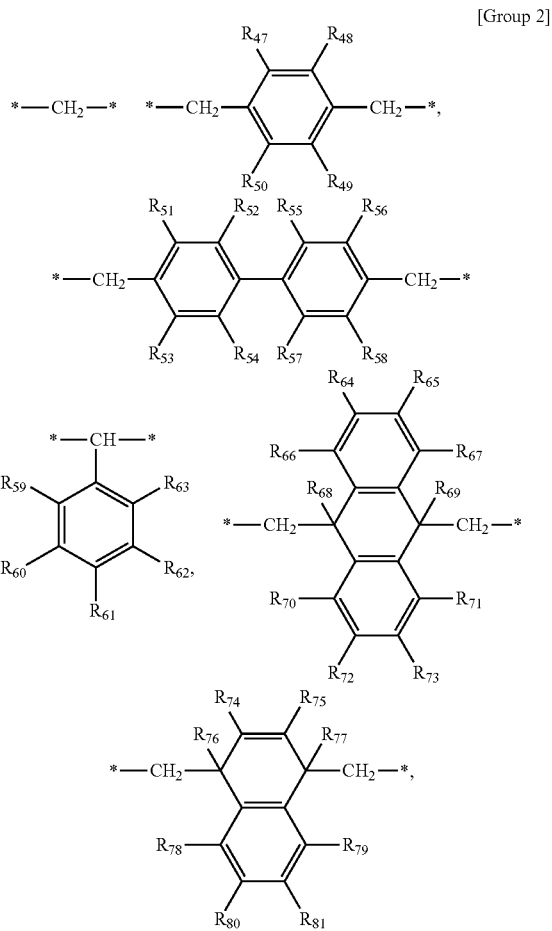

In Group 2, $R_{48}$ to $R_{91}$ may each independently be hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof.

The aromatic ring-containing compound may absorb light of a predetermined wavelength region. In an implementation, the light of the predetermined wavelength region may be a short wavelength region, e.g., about 193 nm or about 243 nm.

In an implementation, the aromatic ring-containing compound may include a mixture of two or more aromatic ring-containing compounds having different substituents.

The aromatic ring-containing compound may have a weight average molecular weight of about 1,000 to about 30,000. Maintaining the weight average molecular weight within the above range may help ensure excellent gap-fill properties and planarization characteristics. Also, a desired coating thickness may be achieved by securing solubility.

The aromatic ring-containing compound may be included in the composition in an amount of about 1 to about 20 parts by weight, based on 100 parts by weight of the solvent. In an implementation, the aromatic ring-containing compound may be included in an amount of about 5 to about 15 parts by weight. Maintaining the aromatic ring-containing compound within the range may help ensure god coating characteristics while also improving optical properties.

The solvent is not particularly limited. For example the aromatic ring-containing compound should exhibit sufficient solubility or dispersion in the solvent. In an implementation, the solvent may include at least one selected from the group of propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, and acetylacetone.

The hard mask composition may further include an additive including, e.g., a surfactant, an acid catalyst, and/or a cross-linking agent.

The hard mask composition may be prepared in the form of a solution and may be applied using a spin-on-coating process. Then, the applied composition may undergo a heat treatment so as to form the hard mask layer.

A coating thickness of the hard mask composition and conditions of the heat treatment are not specifically limited. For example, the hard mask composition may be applied to a thickness of about 500 to about 10,000 Å; and the heat treatment may be performed at about 100 to about 300° C. for about 10 seconds to about 10 minutes.

Before the hard mask layer is formed, another auxiliary layer may be formed. In an implementation, the auxiliary layer may be a silicon-containing thin film. For example, the auxiliary layer may be a thin film formed of silicon nitride or silicon oxide.

In another implementation, before the formation of the auxiliary layer, a bottom anti-reflective coating (BARC) layer may be further formed.

Then, a resist layer may be applied onto the hard mask layer. The resist layer may be a radiation-sensitive imaging layer including a photosensitive material.

Then, the resist pattern may be formed by exposing and developing the resist layer. In an implementation, the exposure may be performed using ArF, KrF, or E-beam. In addition, after the exposure, a baking process may be performed at about 150 to about 500° C.

Then, a portion of the hard mask layer may be selectively removed using the resist pattern as a mask. When the auxiliary layer and/or the bottom anti-reflective coating layer are also formed, a portion thereof may be removed together. As a result, a portion of the material layer may be exposed.

Then, the exposed portion of the material layer may be etched. In an implementation, the etching may be performed by a dry etching process using an etching gas. The etching gas may include, e.g., $CHF_3$, $CF_4$, $CH_4$, $Cl_2$, $BCl_3$, or a mixed gas thereof.

Then, a pattern of the material layer may be formed by removing the hard mask layer and the resist layer (using a stripper).

The pattern may include, e.g., a metal pattern, a semiconductor pattern, and/or an insulation pattern. In an implementation, the pattern may include diverse patterns inside a semiconductor integrated circuit device. When the semiconductor integrated circuit device includes the patterns, the patterns may be, e.g., metal lines, semiconductor patterns, or insulation layers including contact holes, bias holes, and damascene trenches.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Synthesis of Aromatic Ring-Containing Compound

Synthesis Example 1

A 500 ml 3-neck flask equipped with a thermometer, a condenser, and a mechanical agitator was prepared, and the 3-neck flask was immersed in an oil thermostat bath set at 90 to 100° C. The thermostat bath was put on a hot plate, and agitation was performed using a stirring bar while maintaining a constant temperature. Herein, the cooling water temperature of the condenser was set to 5° C.

Subsequently, 28.83 g of (0.2 mol) 2-naphthol and 12.08 g (0.34 mol) of paraformaldehyde were put into the 3-neck flask. Subsequently, 0.57 g (3 mmol) of p-toluene sulfonic acid monohydrate was dissolved in 163 g of propylene glycol monomethylether acetate (PGMEA), and the solution was put into the 3-neck flask and agitated and reacted for 15 to 20 hours.

Samples were gathered from the polymerization reactant on an hourly basis, and the weight average molecular weights of the samples were measured. The reaction was completed when the weight average molecular weights fell between 1,800 and 2,500. Herein, the weight average molecular weights were measured by preparing diluted samples. The diluted samples were prepared by taking samples of 1 g from the polymerization reactant, quenching the samples to a room temperature, taking 0.02 g of each sample, and diluting it in a tetrahydrofuran (THF) solvent until an amount of solid reached 4 wt %.

After the polymerization reaction was completed, the reactant was slowly cooled to room temperature.

The reactant was put into 40 g of distilled water and 400 g of methanol, agitated strongly, and allowed to stand. The supernatant was removed, and the sediment was dissolved in 80 g of propylene glycol monomethylether acetate (PGMEA), and strongly agitated in 320 g of methanol and allowed to stand as a primary process. The supernatant acquired herein was removed again, and the sediment was dissolved in 80 g of propylene glycol monomethylether acetate (PGMEA) as a secondary process. The primary and secondary processes are referred to as a one-time refining process, and the one-time refining process was performed three times in total. A polymer obtained after the refining was dissolved in 80 g of propylene glycol monomethylether acetate (PGMEA), and the methanol and distilled water remaining in the solution were removed under a reduced pressure.

An aromatic ring-containing compound including a moiety represented by the following Chemical Formula 1a was obtained. The aromatic ring-containing compound had a weight average molecular weight of 1,950 and polydispersity of 1.38.

[Chemical Formula 1a]

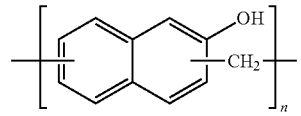

Synthesis Example 2

An aromatic ring-containing compound was obtained according to the same method as Example 1, except that 36.45 g (0.2 mol) of 1-naphthol, 36.45 g (0.2 mol) of 2-naphthol, and 24.16 g (0.8 mol) of paraformaldehyde were used (instead of 28.83 g (0.2 mol) of 2-naphthol and 12.08 g (0.34 mol) of paraformaldehyde).

An aromatic ring-containing compound including a moiety represented by the following Chemical Formula 2a was acquired. The aromatic ring-containing compound had a weight average molecular weight of 2,100 and polydispersity of 1.48.

[Chemical Formula 2a]

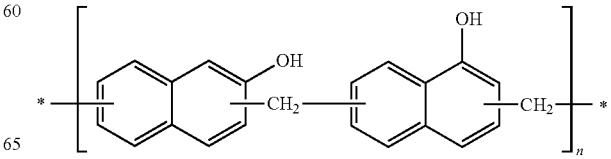

Synthesis Example 3

An aromatic ring-containing compound was obtained according to the same method as Example 1, except that 21.26 g (0.2 mol) of phenol, 36.45 g (0.2 mol) of 2-naphthol, and 24.16 g (0.8 mol) of paraformaldehyde were used (instead of 28.83 g (0.2 mol) of 2-naphthol and 12.08 g (0.34 mol) of paraformaldehyde).

An aromatic ring-containing compound including a moiety represented by the following Chemical Formula 3a was acquired. The aromatic ring-containing compound had a weight average molecular weight of 2,500 and polydispersity of 1.52.

[Chemical Formula 3a]

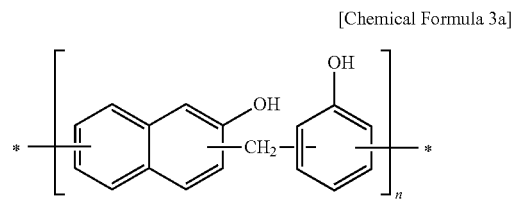

Synthesis Example 4

An aromatic ring-containing compound was obtained according to the same method as Example 1, except that 49.61 g (0.2 mol) of 1-acenaphthylene-5-yl-methanol, 36.45 g (0.2 mol) of 2-naphthol, and 24.16 g (0.8 mol) of paraformaldehyde were used (instead of 28.83 g (0.2 mol) of 2-naphthol and 12.08 g (0.34 mol) of paraformaldehyde).

An aromatic ring-containing compound including a moiety represented by the following Chemical Formula 4a was acquired. The aromatic ring-containing compound had a weight average molecular weight of 2,050 and polydispersity of 1.42.

[Chemical Formula 4a]

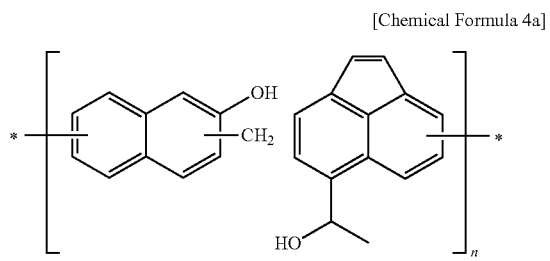

Synthesis Example 5

An aromatic ring-containing compound was obtained according to the same method as Example 1, except that 67.92 g (0.2 mol) of 1-hydroxy perylene, 36.45 g (0.2 mol) of 2-naphthol, and 24.16 g (0.8 mol) of paraformaldehyde were used (instead of 28.83 g (0.2 mol) of 2-naphthol and 12.08 g (0.34 mol) of paraformaldehyde).

An aromatic ring-containing compound including a moiety represented by the following Chemical Formula 5a was acquired. The aromatic ring-containing compound had a weight average molecular weight of 2,170 and polydispersity of 1.46.

[Chemical Formula 5a]

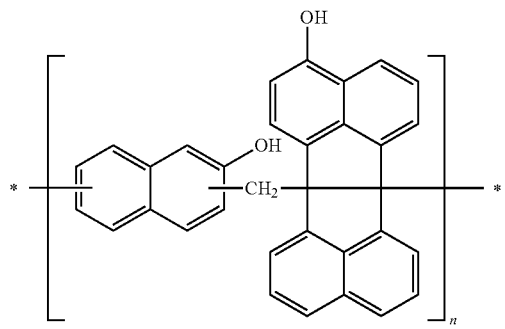

Comparative Synthesis Example 1

8.75 g (0.05 mol) of α,α'-dichloro-p-xylene, 26.66 g of aluminum chloride, and 200 g of γ-butyrolactone were put into a 1 L 4-neck flask equipped with a condenser, a mechanical agitator, a 300 ml dripping funnel, and a nitrogen gas inlet tube, and then agitated while inflowing nitrogen gases to thereby prepare a mixed solution.

After 10 minutes, a solution prepared by dissolving 35.03 g (0.10 mol) of 4,4'-(9-fluorenylidene)diphenol in 200 g of γ-butyrolactone was slowly dripped into the above mixed solution for 30 minutes and agitated at 115° C. for 13 hours to induce polymerization.

After the polymerization reaction was finished, acid was removed using water and condensed by using an evaporator. Subsequently, a polymerization product was diluted using methylamylketone and methanol, and then the concentration was adjusted again by adding a solution of a concentration of 15 wt % containing methylamylketone/methanol at a weight ratio of 4/1 thereto. A polymer with a weight average molecular weight of 12,000 and polydispersity of 2.0 and including a moiety represented by the following Chemical Formula 3 was obtained by putting the solution into a 3 L separatory funnel and adding n-heptane thereto so as to remove a low molecular weight material, e.g., monomers.

[Chemical Formula 3]

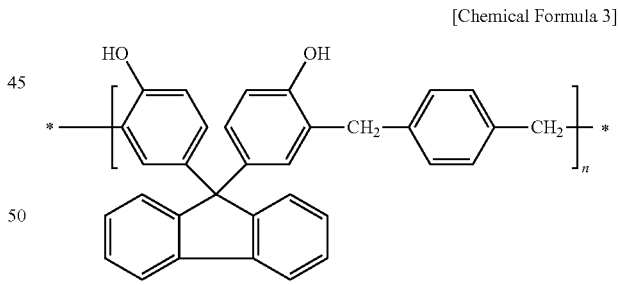

Comparative Synthesis Example 2

A 2000 ml 3-neck flask equipped with a thermometer, a condenser, a mechanical agitator, and a dripping funnel was prepared, and the 3-neck flask was immersed in an oil thermostat bath set to 130 to 150° C. The thermostat bath was put on a hot plate, and agitated using a stirring bar. Herein, the cooling water temperature of the condenser was set to 40° C.

Subsequently, 65.48 g (1 mol) of 1-hydroxypyrene and 103.12 g (1 mol) of 9,9'-bis(phenol)fluorene were put into the 3-neck flask. 270.34 g of propylene glycol monomethylether acetate (PGMEA) was added thereto and dissolved. Subsequently, 4.62 g (0.05 mol) of diethylsulfate was added to the acquired product.

199.48 g (2.0 mol) of 1,4-bismethoxymethylbenzene was added to the dripping funnel, and when the temperature of the 3-neck flask reached 130° C., the 1,4-bismethoxymethylbenzene was slowly added to the 3-neck flask over 1.5 hours.

Samples were taken out of the polymerization reactant on an hourly basis, and the weight average molecular weight of each sample was measured. The reaction was stopped when the weight average molecular weight was between 2,500 and 3,500. The weight average molecular weight was measured by taking a sample of 1 g from the polymerization reactant, quenching the sample to room temperature, taking 0.02 g of the sample, and diluting the sample with a tetrahydrofuran (THF) solvent until the concentration of solid reached 4 wt %.

4.48 g (0.03 mol) of triethanolamine was put into the 3-neck flask as a neutralizer and agitated in order to terminate the reaction at a determined reaction termination moment. Subsequently, the reactant was slowly cooled to room temperature.

A polymer solution was prepared by diluting the reactant with 500 g of propylene glycol monomethylether acetate (PGMEA). Subsequently, the polymer solution was put into a 2,000 ml separatory funnel and agitated vigorously while dripping 4 kg of a mixed solvent of methanol and ethylene glycol (90:10 g/g) therein.

As a result, a polymer was collected at the bottom of the flask, and the supernatant was separated and kept aside. After the supernatant was removed, an aromatic ring-containing compound including a moiety represented by the following Chemical Formula 4 was obtained by performing rotary evaporation at 60° C. for 10 minutes to remove methanol from the final reactant.

The weight average molecular weight of the aromatic ring-containing compound was 12,000, and its polydispersity was 2.3.

Preparation of Hard Mask Composition

Example 1

A hard mask composition was prepared by dissolving 0.8 g of the aromatic ring-containing compound obtained from Synthesis Example 1, 0.2 g of a glycoluril derivative cross-linking agent (Powerlink 1174) represented by the following Chemical Formula A, and 2 mg of pyridinium p-toluene sulfonate in 9 g of propylene glycol monomethylether acetate (PGMEA) followed by filtering.

[Chemical Formula A]

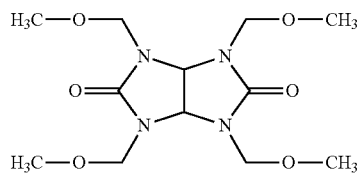

Example 2

A hard mask composition was prepared according to the same method as Example 1, except that the aromatic ring-containing compound obtained from Synthesis Example 2 was used (instead of the aromatic ring-containing compound obtained from Synthesis Example 1).

Example 3

A hard mask composition was prepared according to the same method as Example 1, except that the aromatic ring-

[Chemical Formula 4]

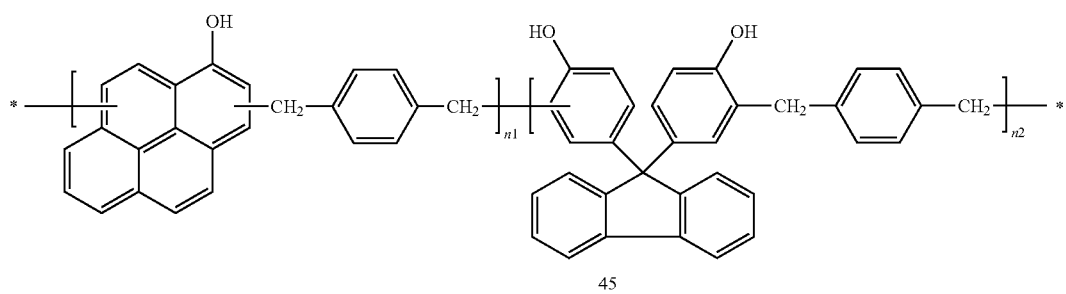

Comparative Synthesis Example 3

An aromatic ring-containing compound was obtained according to the same method as Example 1, except that 36.45 g (0.2 mol) of 1-naphthol was used (instead of 28.83 g (0.2 mol) of 2-naphthol).

An aromatic ring-containing compound including a moiety represented by the following Chemical Formula 5 was acquired. The aromatic ring-containing compound had a weight average molecular weight of 2,000 and polydispersity of 1.38.

[Chemical Formula 5]

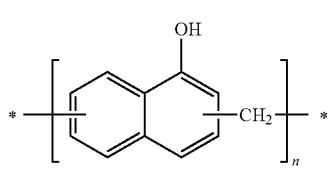

containing compound obtained from Synthesis Example 3 was used (instead of the aromatic ring-containing compound obtained from Synthesis Example 1).

Example 4

A hard mask composition was prepared according to the same method as Example 1, except that the aromatic ring-containing compound obtained from Synthesis Example 4 was used (instead of the aromatic ring-containing compound obtained from Synthesis Example 1).

Example 5

A hard mask composition was prepared according to the same method as Example 1, except that the aromatic ring-containing compound obtained from Synthesis Example 5 was used (instead of the aromatic ring-containing compound obtained from Synthesis Example 1).

Comparative Example 1

A hard mask composition was prepared according to the same method as Example 1, except that the aromatic ring-containing compound obtained from Comparative Synthesis Example 1 was used (instead of the aromatic ring-containing compound obtained from Synthesis Example 1).

Comparative Example 2

A hard mask composition was prepared according to the same method as Example 1, except that the aromatic ring-containing compound obtained from Comparative Synthesis Example 2 was used (instead of the aromatic ring-containing compound obtained from Synthesis Example 1).

Comparative Example 3

A hard mask composition was prepared according to the same method as Example 1, except that the aromatic ring-containing compound obtained from Comparative Synthesis Example 3 was used (instead of the aromatic ring-containing compound obtained from Synthesis Example 1).

Formation of Hard Mask Layer

Hard mask layers (each having a thickness of 3,000 Å) were formed by applying the hard mask compositions of Examples 1 to 5 onto silicon wafers (where a silicon nitride layer was formed), respectively, through a spin coating process, and baking them at 240° C. for 60 seconds.

Evaluation—1

Refractive indices (n) and extinction coefficients (k) of the hard mask layers formed of the hard mask compositions prepared according to Examples 1 to 5 were measured. The refractive indices and extinction coefficients were measured using an ellipsometer (produced by J.A. Woollam Company) while radiating light of 193 nm and 248 nm.

The measurement results are shown in the following Table 1.

TABLE 1

| | Optical property at 193 nm | | Optical property at 248 nm | |
|---|---|---|---|---|
| | Refractive index (n) | Extinction coefficient (k) | Refractive index (n) | Extinction coefficient (k) |
| Example 1 | 1.34 | 0.34 | 2.20 | 0.69 |
| Example 2 | 1.35 | 0.35 | 2.25 | 0.68 |
| Example 3 | 1.32 | 0.55 | 2.35 | 0.71 |
| Example 4 | 1.36 | 0.31 | 2.18 | 0.66 |
| Example 5 | 1.40 | 0.53 | 2.40 | 0.70 |

Referring to Table 1, the hard mask layers formed of the hard mask compositions prepared according to Examples 1 to 5 showed refractive indices (n) and extinction coefficients (k) that are appropriate for a hard mask layer with respect to light of 193 nm and 248 nm.

Formation of Resist Pattern

Upper surfaces of silicon wafers (including a silicon nitride layer thereon) were respectively coated with the hard mask compositions prepared according to Examples 1 to 5 and Comparative Examples 1 to 3 through a spin coating method. Then, the silicon wafers were baked at 240° C. for 60 seconds so as to form hard mask layers having a thickness of about 5,000 Å.

An upper surface of each hard mask layer was coated with a KrF-dedicated resist, and then the hard mask layers were baked at 110° C. for 60 seconds and exposed using ASML (XT:1400, NA0.93), i.e., KrF exposure equipment. Subsequently, a resist pattern was formed by performing development with a 2.38 wt % tetramethylammonium hydroxide (TMAH) aqueous solution.

Evaluation—2

Exposure latitude (EL) margins (according to variation of exposure amount) and depth of focus (DoF) margins (according to variation of distance from a light source) were observed. Also, whether undercut occurred in the patterned hard mask layer was observed using an FE-SEM.

The observation results are presented in the following Table 2. "X" in Table 2 means that under-cut has not occurred; and "○" in Table 2 means that under-cut has occurred.

TABLE 2

| | EL margin(Δ CD/ exposure energy, mJ) | DoF margin (μm) | Whether under-cut has occurred |
|---|---|---|---|
| Example 1 | 0.3 | 0.4 | X |
| Example 2 | 0.4 | 0.5 | X |
| Example 3 | 0.3 | 0.5 | X |
| Example 4 | 0.4 | 0.4 | X |
| Example 5 | 0.3 | 0.4 | X |
| Comparative Example 1 | 0.1 | 0.1 | ○ |
| Comparative Example 2 | 0.3 | 0.3 | ○ |
| Comparative Example 3 | 0.2 | 0.2 | ○ |

Referring to Table 2, the hard mask layers formed of the hard mask compositions prepared according to Examples 1 to 5 showed high EL margins and DoF margins, compared with the hard mask layers formed of the hard mask compositions prepared according to Comparative Examples 1 and 3. Also, no undercut was observed in the hard mask layers formed of the hard mask compositions prepared according to Examples 1 to 5. Rather, excellent profiles were observed.

Formation of Pattern

The silicon nitride layers were individually dry-etched using the patterned hard mask layer as a mask; and a mixed gas of $CHF_3/CF_4$, and then dry-etched once again using a mixed gas of $BCl_3/Cl_2$. Subsequently, the remaining organic materials were all removed using oxygen ($O_2$) gas.

Evaluation—3

The hard mask layers and the patterns of the silicon nitride were examined using an FE-SEM. The examination results are presented in the following Table 3.

TABLE 3

| | Pattern profile |
|---|---|
| Example 1 | Vertical shape (anisotropic) |
| Example 2 | Vertical shape (anisotropic) |
| Example 3 | Vertical shape (anisotropic) |
| Example 4 | Vertical shape (anisotropic) |
| Example 5 | Vertical shape (anisotropic) |
| Comparative Example 1 | Tapered shape, rough surface |
| Comparative Example 2 | Tapered shape |
| Comparative Example 3 | Tapered shape, rough surface |

It may be seen from Table 3 that the hard mask layers formed of the hard mask compositions prepared according to Comparative Examples 1 and 3 and the silicon nitride layers under the hard mask layers were not isotropically patterned in vertical shapes, but rather were tapered. In contrast, the hard mask layers formed of the hard mask compositions prepared according to Examples 1 to 5 and the silicon nitride layers under the hard mask layers were all isotropically patterned in vertical shapes.

It may be seen that when the hard mask compositions prepared according to Examples 1 to 5 were used, resistance against the etching gas was sufficient and the etching process was excellently performed. On the other hand, when the hard mask compositions prepared according to Comparative Examples 1 and 3 were used, the resistance against the etching gas was not sufficient; and this led to insufficient etching selectivity to pattern the silicon nitride in an appropriate shape.

Evaluation—4

Patterned wafers were coated with the hard mask compositions prepared according to Examples 1 to 5 and Comparative Examples 1 to 3 and then baked. Their gap-fill properties and planarization characteristics were observed using V-SEM equipment.

The gap-fill properties were evaluated by observing the cross-sections of each pattern with a scanning electron microscope (SEM) and determining whether there was a void. The planarization characteristics were evaluated based on the following Equation 1. The smaller the difference between h1 and h2 (as illustrated in FIG. 1), the better the planarization characteristics were. Therefore, as the number became smaller, the planarization characteristics were improved.

$$Planarization = \left(1 - \frac{h_2}{h_1}\right) \times 100 \qquad \text{[Equation 1]}$$

The evaluation results are presented in the following Table 4.

TABLE 4

| | Planarization characteristics and gap-fill properties | | | |
|---|---|---|---|---|
| | Left | Center | Right | Gap-fill properties |
| Example 1 | 13.05 | 12.80 | 12.95 | No void |
| Example 2 | 14.55 | 14.21 | 14.86 | No void |
| Example 3 | 13.31 | 13.28 | 13.29 | No void |
| Example 4 | 15.95 | 15.66 | 16.08 | No void |
| Example 5 | 21.63 | 21.33 | 21.59 | No void |
| Comparative Example 1 | 97.28 | 97.14 | 97.61 | Void existed |
| Comparative Example 2 | 88.99 | 88.64 | 88.91 | Void existed |
| Comparative Example 3 | 92.01 | 91.38 | 91.55 | Void existed |

It may be seen from Table 4 that when the hard mask compositions of Examples 1 to 5 were used, the extent of planarization was excellent because almost the same height was maintained in the left, middle, and right. In addition, no void was observed. Thus, the gap-fill properties were excellent. When the hard mask compositions prepared according to Comparative Examples 1 to 3 were used, the extent of planarization and gap-fill properties were poor.

By way of summation and review, the hard mask layer may undergo a lithography technique and thus may have high etch selectivity, sufficient resistance against multiple etching processes, and may minimize reflectivity between the resist and the layer under the hard mask layer. A pattern formed using such a hard mask composition may have improved optical properties.

The hard mask layer may be used for a dual damascene process. The dual damascene process may include a trench-first dual damascene (TFDD) process, a via-first dual damascene (VFDD) process, and a hard mask dual damascene (HMDD) process. Among them, the VFDD process may require gap-fill properties and planarization characteristics in addition to the above-described etching resistance and optical properties.

Accordingly, the embodiments provide a hard mask composition that has excellent gap-fill properties and planarization characteristics and is used to prepare a hard mask layer having improved etch resistance and optical properties.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A hard mask composition, comprising:
a solvent; and
an aromatic ring-containing compound, the aromatic ring-containing compound including at least one of a moiety represented by the following Chemical Formula 1 and a moiety represented by the following Chemical Formula 2:

[Chemical Formula 1]

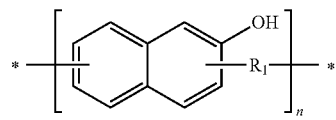

[Chemical Formula 2]

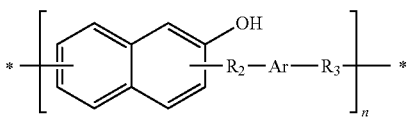

wherein:
Ar is an aromatic ring group,
$R_1$ to $R_3$ are each independently a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, and
n is 1 to about 100.

2. The hard mask composition as claimed in claim 1, wherein:
the aromatic ring-containing compound includes the moiety represented by Chemical Formula 2, and
Ar is an aromatic ring group selected from substituted or unsubstituted aromatic ring groups shown in the following Group 1:

[Group 1]

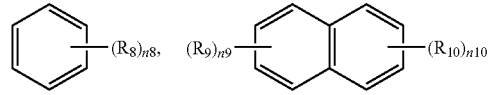

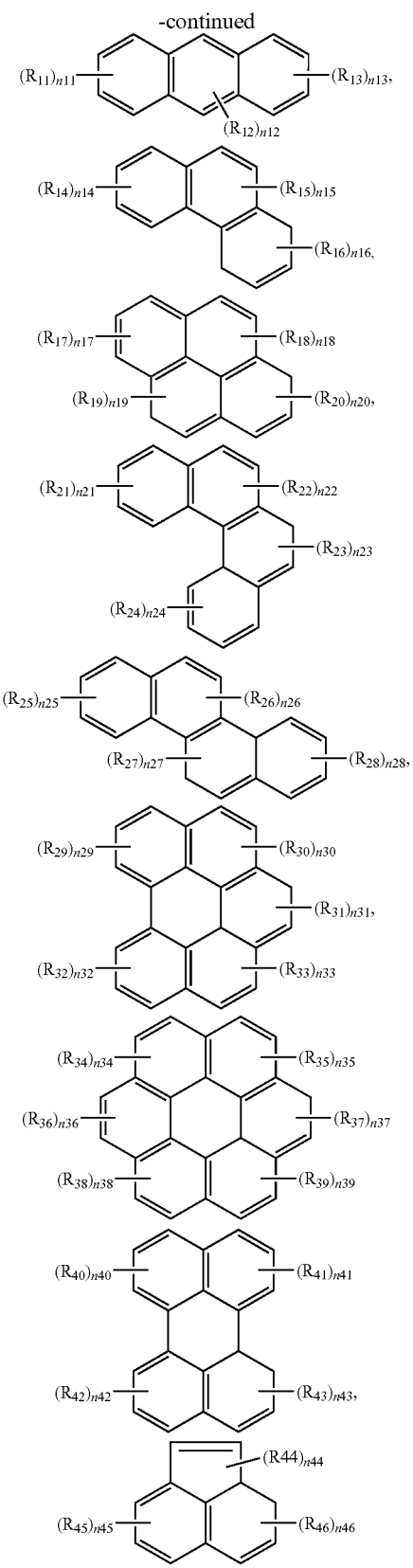

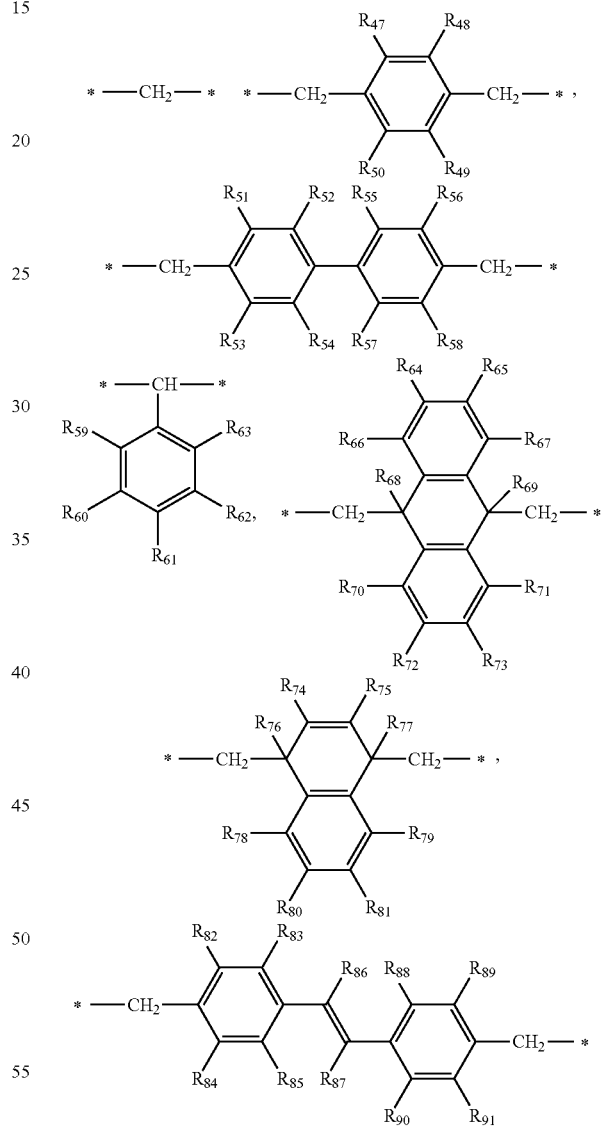

wherein $R_8$ to $R_{46}$ are each independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, and $n_8$ to $n_{46}$ are each independently 1 to 5.

3. The hard mask composition as claimed in claim 1, wherein $R_1$ to $R_3$ are each independently one of a substituted or unsubstituted coupler shown in the following Group 2:

[Group 2]

wherein $R_{47}$ to $R_{91}$ are each independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof.

4. The hard mask composition as claimed in claim 1, wherein the aromatic ring-containing compound has a weight average molecular weight of about 1,000 to about 30,000.

5. The hard mask composition as claimed in claim 1, wherein the aromatic ring-containing compound is included in the composition in an amount of about 1 to about 20 parts by weight, based on 100 parts by weight of the solvent.

6. The hard mask composition as claimed in claim 1, wherein the solvent includes at least one selected from the group of propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, and acetylacetone.

7. A method for forming a pattern, the method comprising:
providing a material layer on a substrate;
forming a hard mask layer on the material layer such that the hard mask layer is prepared from a hard mask composition including:
a solvent, and
an aromatic ring-containing compound, the aromatic ring-containing compound including at least one of a moiety represented by the following Chemical Formula 1 and a moiety represented by the following Chemical Formula 2;
forming a resist layer on the hard mask layer;
forming a resist pattern by exposing and developing the resist layer;
selectively removing a portion of the hard mask layer, using the resist pattern as a mask, to expose a portion of the material layer; and
etching the exposed portion of the material layer:

[Chemical Formula 1]

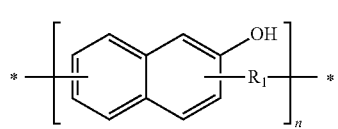

[Chemical Formula 2]

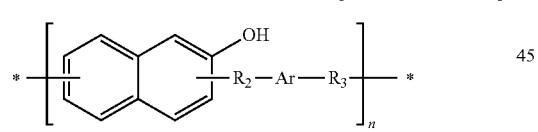

wherein:
Ar is an aromatic ring group,
$R_1$ to $R_3$ are each independently a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, and
n is 1 to about 100.

8. The method as claimed in claim 7, wherein:
the aromatic ring-containing compound includes the moiety represented by Chemical Formula 2, and Ar is an aromatic ring group selected from substituted or unsubstituted aromatic ring groups shown in the following Group 1:

[Group 1]

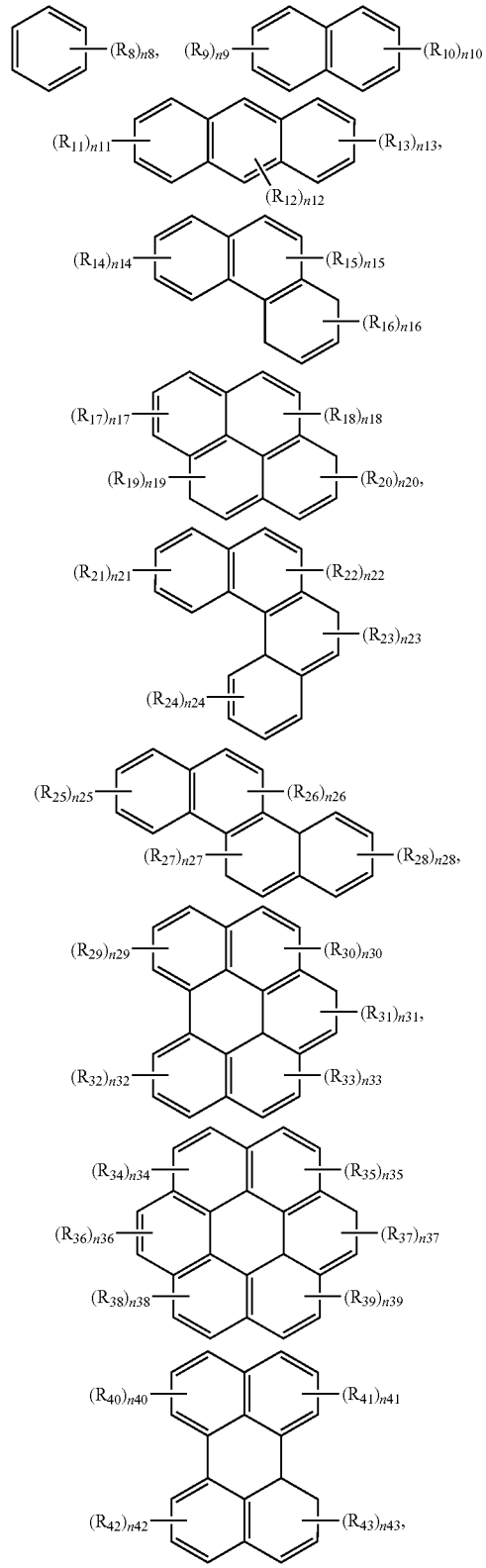

-continued

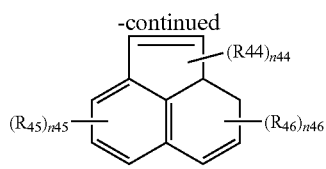

wherein $R_8$ to $R_{46}$ are each independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, and $n_8$ to $n_{46}$ are each independently 1 to 5.

9. The method as claimed in claim 7, wherein $R_1$ to $R_3$ are each independently one of a substituted or unsubstituted coupler shown in the following Group 2:

[Group 2]

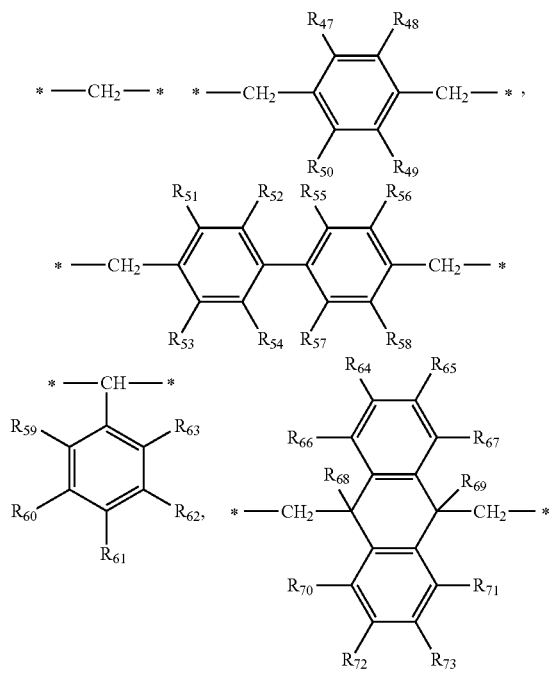

-continued

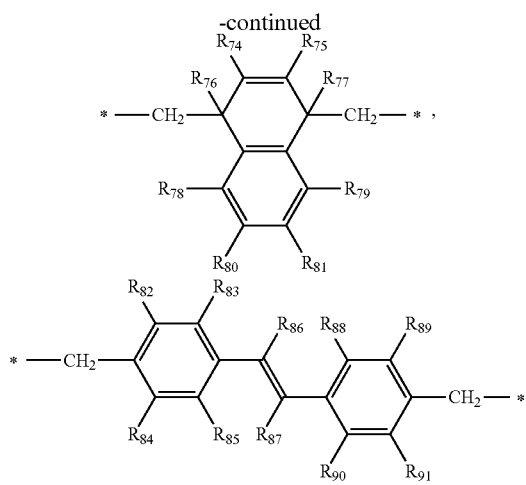

wherein $R_{47}$ to $R_{91}$ are each independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof.

10. The method as claimed in claim 7, wherein the aromatic ring-containing compound has a weight average molecular weight of about 1,000 to about 30,000.

11. The method as claimed in claim 7, wherein the solvent includes at least one selected from the group of propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, and acetylacetone.

12. The method as claimed in claim 7, wherein forming the hard mask layer includes applying the hard mask composition by a spin-on-coating process.

13. The method as claimed in claim 7, further comprising forming a silicon-containing auxiliary layer on the material layer prior to forming the resist layer.

14. The method as claimed in claim 13, further comprising forming a bottom antireflective coating layer (BARC) prior to forming the resist layer.

* * * * *